(12) United States Patent
Lu et al.

(10) Patent No.: US 11,515,445 B2
(45) Date of Patent: Nov. 29, 2022

(54) CORE-SHELL TYPE QUANTUM DOTS AND METHOD OF FORMING THE SAME

(71) Applicant: OPULENCE OPTRONICS CO., LTD, Hsinchu County (TW)

(72) Inventors: Yuan-Chang Lu, Hsinchu County (TW); Shang-Wei Chou, Hsinchu County (TW)

(73) Assignee: OPULENCE OPTRONICS CO., LTD, Hsinchu County (TW)

( * ) Notice: Subject to any disclaimer, the term of this patent is extended or adjusted under 35 U.S.C. 154(b) by 21 days.

(21) Appl. No.: 16/800,142

(22) Filed: Feb. 25, 2020

(65) Prior Publication Data

US 2020/0274026 A1 Aug. 27, 2020

Related U.S. Application Data

(60) Provisional application No. 62/810,406, filed on Feb. 26, 2019.

(51) Int. Cl.
*H01L 33/06* (2010.01)
*H01L 33/00* (2010.01)

(52) U.S. Cl.
CPC .......... *H01L 33/06* (2013.01); *H01L 33/0083* (2013.01)

(58) Field of Classification Search
CPC ... H01L 33/06; H01L 33/0083; C09K 11/565; B82Y 20/00; B82Y 30/00; B82Y 40/00
See application file for complete search history.

(56) References Cited

U.S. PATENT DOCUMENTS

| | | | |
|---|---|---|---|
| 7,192,850 B2* | 3/2007 | Chen | B82Y 10/00 117/11 |
| 8,313,969 B2* | 11/2012 | Reiss | C30B 7/00 438/46 |
| 9,340,726 B2* | 5/2016 | Peng | C09K 11/703 |
| 10,711,184 B2* | 7/2020 | Kroupa | C09K 11/06 |
| 2008/0138514 A1* | 6/2008 | Jang | B01J 13/02 427/213.3 |
| 2010/0289003 A1* | 11/2010 | Kahen | C09K 11/883 257/14 |
| 2011/0031452 A1* | 2/2011 | Krauss | B82Y 20/00 252/519.4 |
| 2015/0315721 A1* | 11/2015 | Zhong | C30B 29/48 117/68 |
| 2015/0329774 A1* | 11/2015 | Gu | H01L 51/0003 252/301.33 |

(Continued)

*Primary Examiner* — Savitri Mulpuri
(74) *Attorney, Agent, or Firm* — Amin, Turocy & Watson, LLP

(57) ABSTRACT

Provided is a core-shell type light-emitting quantum dot, including an alloy type core consisting of Cd, Se, Zn, and S, and a shell layer having a zinc blende structure and being coated on the surface of the alloy core, wherein the element ratio of each of Zn and S accounts for 30 to 50% of the overall core, and the content of Cd and Se gradually decreases outward from the core center. Also provided is a method for preparing the core-shell type light-emitting quantum dot. By having the alloy core and the shell layer with a zinc blende structure, the core-shell type quantum dot can achieve quantum efficiency of 95%, and have high temperature resistance and excellent water- and oxygen-barrier performance.

19 Claims, 10 Drawing Sheets
(5 of 10 Drawing Sheet(s) Filed in Color)

(56) References Cited

U.S. PATENT DOCUMENTS

| | | | |
|---|---|---|---|
| 2016/0200974 A1* | 7/2016 | Smith | C09K 11/892 |
| | | | 252/301.6 S |
| 2018/0156961 A1* | 6/2018 | Miki | G02B 6/0026 |
| 2018/0342645 A1* | 11/2018 | Chou | C09K 11/025 |
| 2019/0330525 A1* | 10/2019 | Hens | C09K 11/706 |
| 2020/0203561 A1* | 6/2020 | Chen | H01L 33/06 |
| 2020/0377791 A1* | 12/2020 | Yang | C09K 11/883 |

\* cited by examiner

CORE-SHELL TYPE QUANTUM DOTS AND METHOD OF FORMING THE SAME

BACKGROUND

1. Technical Field

The present disclosure relates to a quantum dot and a preparation method thereof, and more particularly, to a core-shell type light-emitting quantum dot and a preparation method thereof.

2. Description of the Related Art

Quantum dots are nano-sized particles. Owing to their size which is smaller than twice the Bohr exciton radius of an electron, quantum confinement occurs, forming a discontinuous energy band. Accordingly, the quantum dot has characteristic of spontaneous fluorescence after being stimulated. Such light and electrical characteristics caused by the special effect allows the quantum dot materials to be widely applied in the fields of light emitting diodes, solar cells, photodetectors, liquid crystal displays, color enhancement films, color filters, and so on.

The existing quantum dot materials, however, have problems such as insufficient color purity and luminous efficiency due to the difficulty in controlling their dimensional uniformity. Furthermore, the existing quantum dots have insufficient resistance to temperature and insufficient water and oxygen barrier properties, which not only affect the stability of the applied device, but also limit the promotion and application of such materials.

Therefore, there lies a need for a light-emitting quantum dot with high luminous efficiency, high color purity, good barrier property for water as well as oxygen, and good temperature resistance.

SUMMARY

The present disclosure provides a core-shell type light-emitting quantum dot comprising: an alloy core which consists of Cd, Se, Zn, and S, wherein an element ratio of Zn and S each accounts for 30% to 50% of the overall core, and a content of Cd and Se gradually decreases outward from the core center; and a shell layer which has a zinc blende structure and is coated on a surface of the alloy core.

In an embodiment of the present disclosure, a D90 particle size of the light-emitting quantum dot is 12 to 15 nanometers, and the alloy core has a radius of 3 nanometers or less.

In an embodiment of the present disclosure, the light-emitting quantum dot has an appearance of polygon with a plurality of corners.

In an embodiment of the present disclosure, the shell layer consists of ZnS.

In an embodiment of the present disclosure, an element ratio of Cd and Se each accounts for 3% to 10% of the overall core.

The present disclosure further provides a method for preparing the core-shell type light-emitting quantum dot, comprising: providing a metal precursor solution containing a Cd metal precursor and a Zn metal precursor and activated by a reactive amine; mixing and reacting a first ion stock solution containing S ions and Se ions with the activated metal precursor solution containing the Cd metal precursor and the Zn metal precursor to obtain a solution containing an alloy core; and adding a second ion stock solution containing S ions and a zinc salt to the solution containing the alloy core for an reaction of forming a shell layer which is coated on a surface of the alloy core, thereby obtaining the core-shell type light-emitting quantum dot.

In an embodiment of the method of the present disclosure, the Cd metal precursor is at least one selected from CdO and $Cd(ac)_2$. The Zn metal precursor is at least one selected from ZnO and $Zn(ac)_2$.

In an embodiment of the method of the present disclosure, the activated metal precursor solution containing the Cd metal precursor and the Zn metal precursor is prepared by a process comprising: providing a metal precursor solution containing the Cd metal precursor; activating the Cd metal precursor in the metal precursor solution containing the Cd metal precursor and the Zn metal precursor by a reactive amine and a reactive acid; and adding the Zn metal precursor to the activated metal precursor solution containing the Cd metal precursor to activate the Zn metal precursor at a temperature of from 300° C. to 320° C.

In an embodiment of the method of the present disclosure, the activated metal precursor solution containing the Cd metal precursor and the Zn metal precursor is prepared by a process comprising: providing a metal precursor solution containing the Cd metal precursor and the Zn metal precursor; activating the Cd metal precursor in the metal precursor solution containing the Cd metal precursor and the Zn metal precursor by a reactive amine and a reactive acid; and heating the activated metal precursor solution containing the Cd metal precursor and the Zn metal precursor to a temperature of from 300° C. to 320° C. to activate the Zn metal precursor therein.

In an embodiment of the method of the present disclosure, the reactive acid is oleic acid. In another embodiment, the reactive amine and the reactive acid has a molar ratio of from 1:7 to 1:7.5.

In an embodiment of the method of the present disclosure, the activation temperature of the Cd metal precursor is 300° C. to 320° C.

In an embodiment of the method of the present disclosure, the reactive amine is a primary amine. In another embodiment, the primary amine is oleylamine.

In an embodiment of the method of the present disclosure, the reaction temperature for preparing the alloy core is from 280° C. to 310° C., and the reaction time is 10 to 20 minutes.

In an embodiment of the method of the present disclosure, the step of adding the second ion stock solution containing the S ions and the zinc salt further comprises a step of firstly adding the second ion stock solution containing the S ions to the solution containing the alloy core for a reaction; and after the reaction for 15 to 20 minutes, adding the zinc salt to react for 20 to 30 minutes.

In an embodiment of the method of the present disclosure, the zinc salt is zinc oleate.

In an embodiment of the method of the present disclosure, a reaction temperature for forming the shell layer is 240° C. to 270° C.

In an embodiment of the method of the present disclosure, the reactive amine, the Cd metal precursor and the Zn metal precursor have a molar ratio of from 3:0.14:5.9 to 3:1:5.9.

In an embodiment of the method of the present disclosure, the Cd metal precursor, the Zn metal precursor, the S ions and the Se ions have a molar ratio of from 0.14:5.9:4.2:1.5 to 1:5.9:4.2:1.5.

Based on the preparation method of the present disclosure, a core-shell type light-emitting quantum dot with an alloy core having excellent dimensional uniformity may be obtained, and the luminous color purity may be improved. Moreover, because a reactive amine is used for activation in the present disclosure, a shell layer with a zinc blende structure may be formed on the alloy core. The shell layer with the zinc blende structure provides effective protection for the alloy core, such that the quantum efficiency of the prepared core-shell type light-emitting quantum dot may reach 95%, and the quantum dot may have high temperature resistance and excellent water- and oxygen-barrier performance.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The embodiments of the present disclosure are described by way of examples with reference to the accompanying drawings.

DETAILED DESCRIPTION OF THE PREFERRED EMBODIMENTS

The following is a description of specific embodiments for the present disclosure. Those skilled in the art can easily understand the advantages and effects of the present disclosure from the content disclosed in this specification. The present disclosure can also be implemented or applied by other different embodiments, and various details in this specification can also be given different modifications and changes based on different viewpoints and applications, without departing from the spirit disclosed by the present disclosure. In addition, all ranges and values herein are inclusive and combinable. Any value or point that falls within the range described herein. For example, any integer can be used as the minimum or maximum value to derive the lower range.

Figure 1:
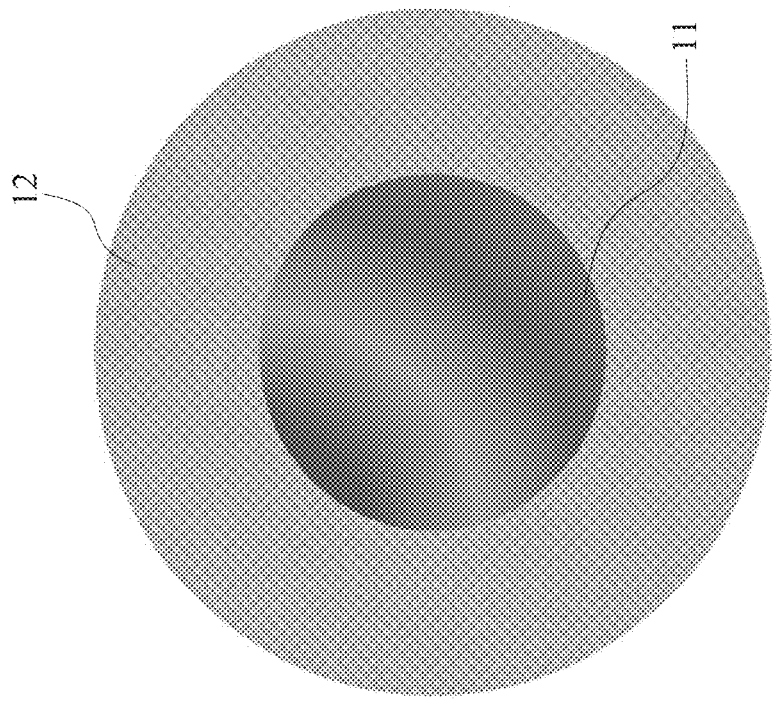
FIG. 1 is a schematic diagram showing the structure of the core-shell type light-emitting quantum dot of the present disclosure.

Referring to FIG. 1, which is a schematic diagram of the structure of the core-shell type light-emitting quantum dot of the present disclosure. The core-shell type light-emitting quantum dot 10 includes: an alloy core 11 composed of Cd, Se, Zn, and S, wherein the element ratio of Zn and S each accounts for 30% to 50% of the overall core, and the content of Cd and Se gradually decreases outward from the core center; and a shell layer 12, which has a zinc blende structure and is coated on the surface of the light-emitting core.

The features and effects of the present disclosure are further described in detail through the following specific embodiments. It shall be understood that the scope of the present disclosure is not limited by the description of the embodiments.

Example 1

To a metal precursor solution containing 0.14 millimoles (mmol) of Cd, 1 milliliters (ml) of oleylamine and 7 ml of oleic acid were added, and the Cd metal precursor was activated at a temperature of 310° C.

Next, 2.9 mmol of Zn metal precursor was added to the activated Cd metal precursor solution, and the Zn metal precursor was activated at a temperature of 310° C.

In addition, a first ion stock solution having 2.2 mmol of S, 1.5 mmol of Se, and 3 ml of trioctylphosphine (TOP) was prepared. Subsequently, under a temperature condition of 280° C. to 310° C., the first ion reserve solution was fed into the activated Cd and Zn metal precursor-containing solution for a reaction. After 10 to 20 minutes of reaction, a solution containing an alloy light-emitting core particle was formed.

Further, a second ion stock solution having 2 mmol of S and 1 ml of TOP was prepared, and then the second ion stock solution was fed into the above-mentioned solution containing the alloy core under a temperature condition of 240° C. to 270° C. to react for 15 to 20 minutes.

After 15 to 20 minutes of reaction, 3 mmol of zinc oleate was added at a temperature condition of 240° C. to 270° C., and the reaction continues for 20 to 30 minutes, thereby obtaining a core-shell type light-emitting quantum dot having the CdSeZnS alloy core and the shell layer with ZnS zinc blende structure.

The quantum efficiency of the core-shell type light-emitting quantum dot, measured by a quantum efficiency tester (HORIBA Scientific), was 94.68%, and the core-shell type light-emitting quantum dot exhibits the full width at half maximum of emission of 20 nanometers, indicating that the quantum dot showed a higher color purity.

Figure 2:
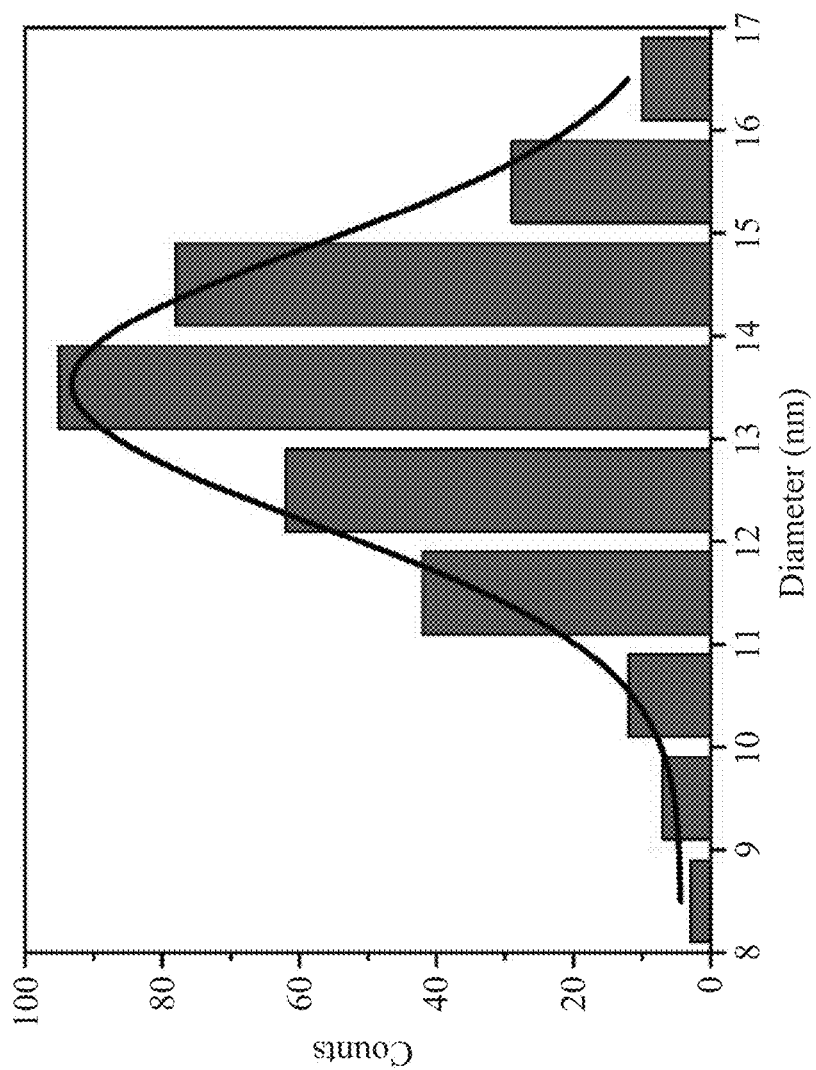
FIG. 2 is a diagram showing the particle size distribution of the core-shell type light-emitting quantum dot according to Example 1 of the present disclosure.

The particle size analyzer was used to analyze the core-shell type light-emitting quantum dot prepared above. As shown in FIG. 2, the D90 particle size of the light-emitting quantum dot was 13.65 nanometers, and the standard deviation of the average particle size was 1.34 nanometers, indicating that the quantum dot had high dimensional uniformity.

Figure 3A:
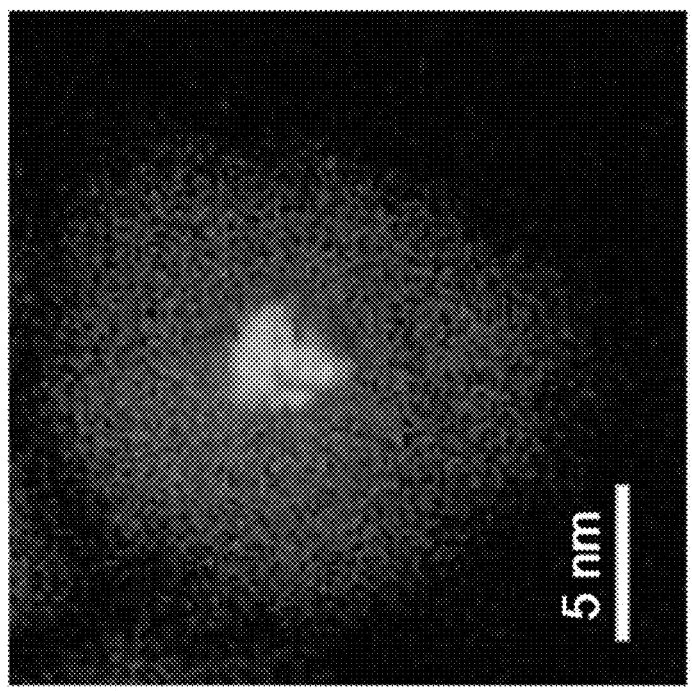
FIG. 3A is a diagram showing elements of cadmium and selenium in the core-shell type light-emitting quantum dots according to Example 1 of the present disclosure, which is analyzed by a scanning transmission electron microscope-energy dispersion spectrometer (STEM-EDS)
Figure 3B:
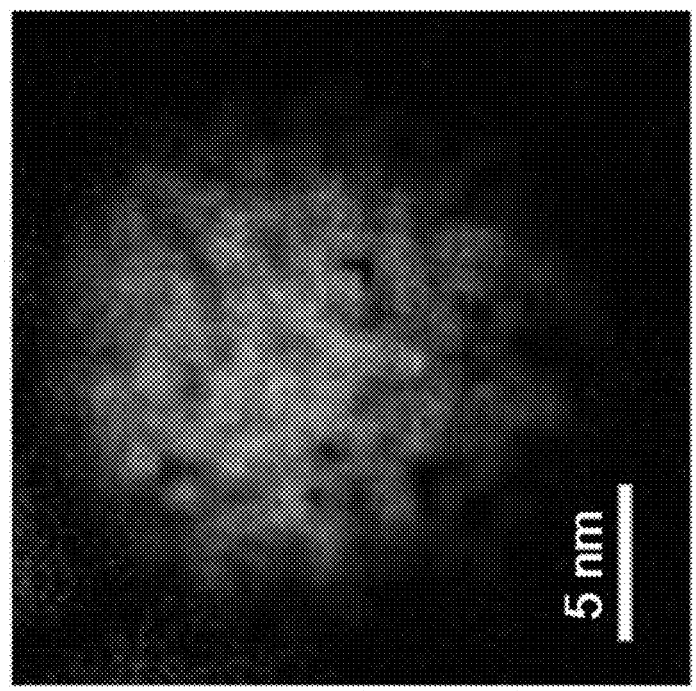
FIG. 3B is a diagram showing elements of zinc and sulfur in the core-shell type light-emitting quantum dots according to Example 1 of the present disclosure, which is analyzed by a scanning transmission electron microscope-energy dispersive spectrometer (STEM-EDS)

The above-mentioned core-shell type light-emitting quantum dot analyzed by a scanning transmission electron microscope-energy dispersion spectrometer (STEM-EDS). FIGS. 3A to 3B showed the distribution of cadmium (red mark), selenium (blue mark), Zinc (green mark), and sulfur (yellow mark).

Figure 3C:
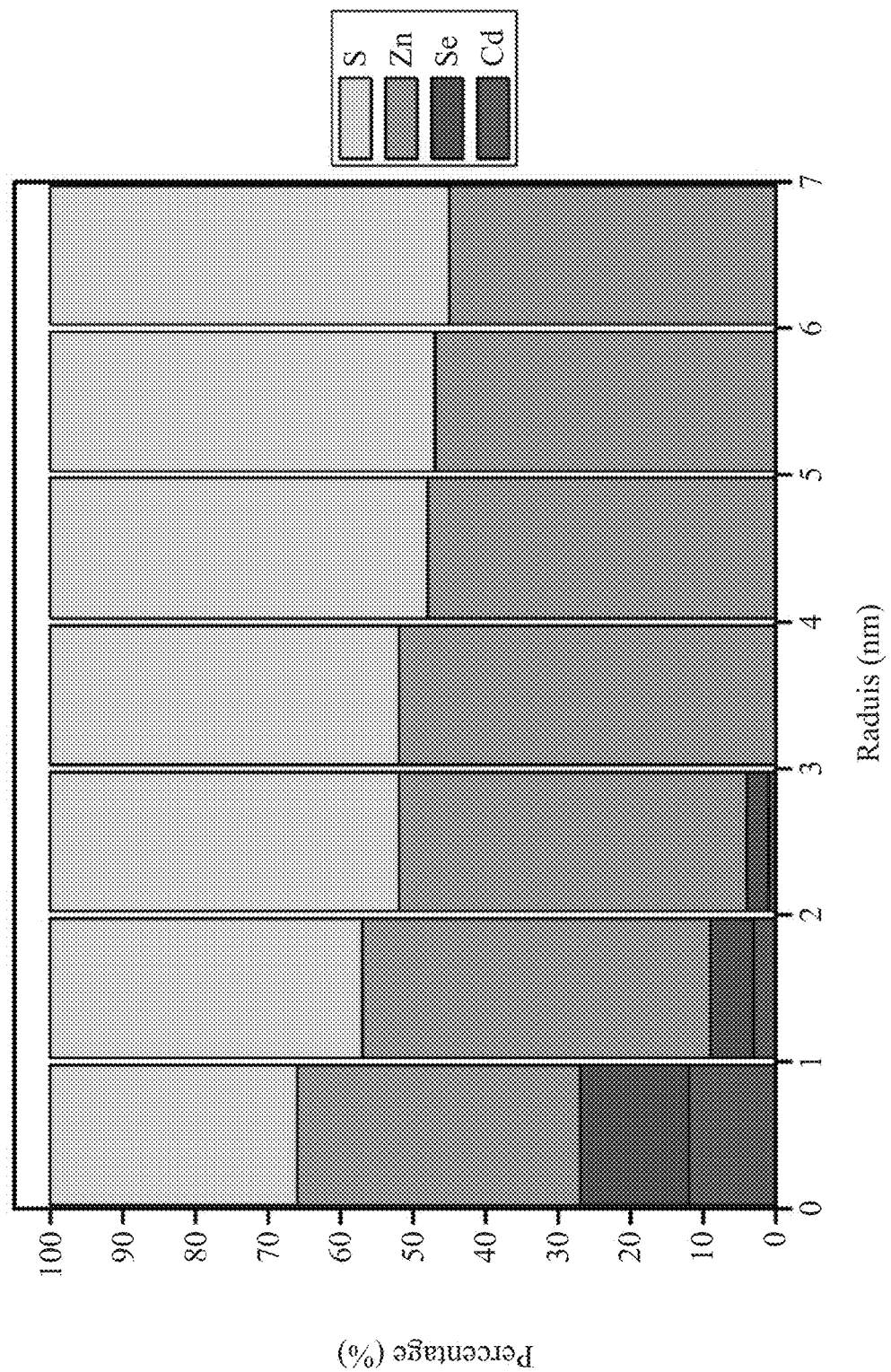
FIG. 3C is a diagram showing an element composition of a single quantum dot of the core-shell type light-emitting quantum dot according to Example 1 of the present disclosure.

In addition, the thickness of the core layer and the elemental composition in a single core-shell type light-emitting quantum dot were determined by an energy dispersive apparatus (EDS). As shown in FIG. 3C, the radius of the quantum dot core in this embodiment was 3 nanometers. The element ratio of Zn and S each accounts for 30% to 50% of the overall core, and the content of Cd and Se gradually decreases outward from the center of the core. Specifically, the element ratio of S was about 42%, the element ratio of Zn was about 46%, the element ratio of Se was about 7%, and the element ratio of Cd was about 5%.

Figure 4A:
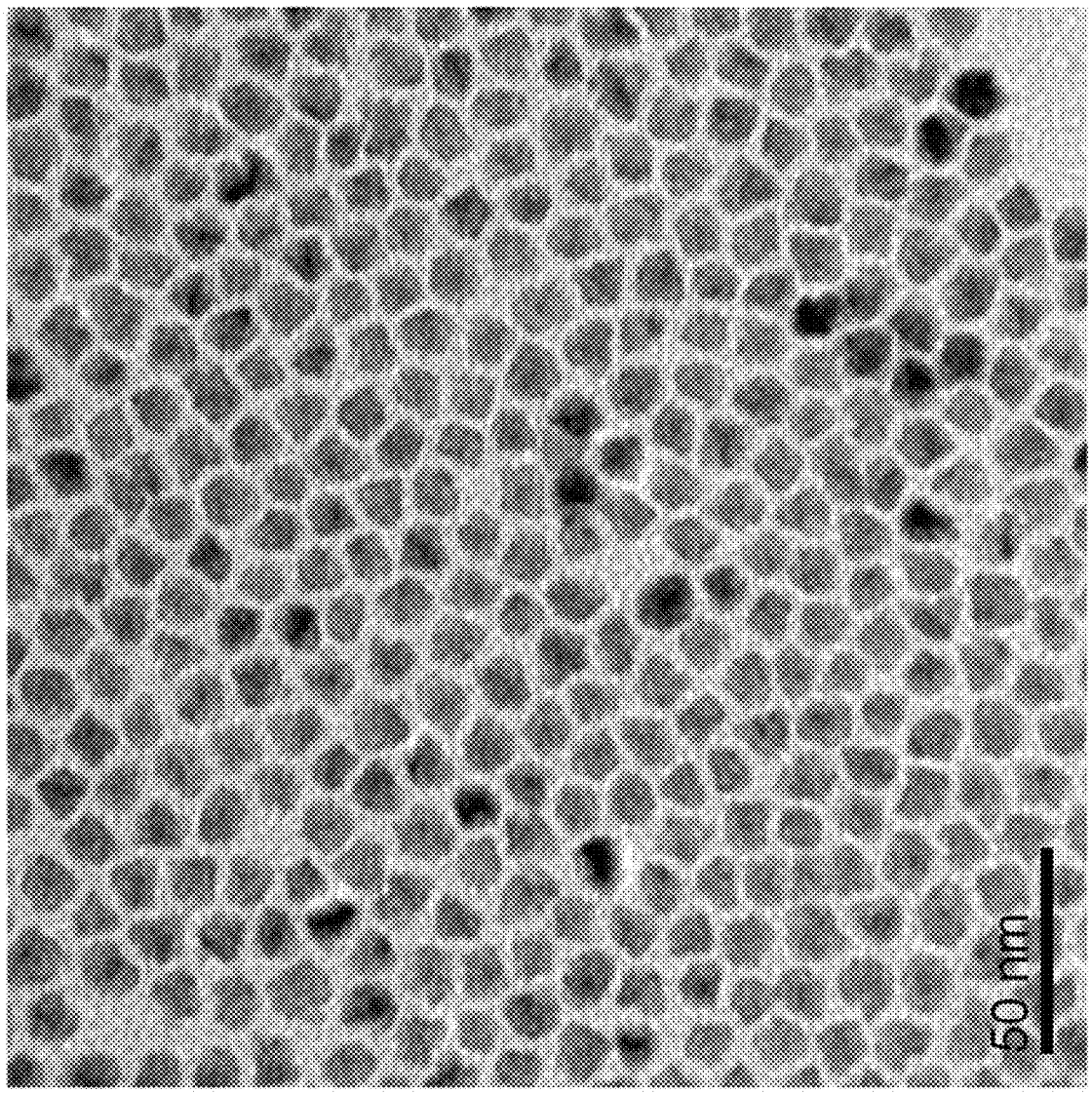
FIG. 4A shows an image of the core-shell type light-emitting quantum dot according to Example 1 of the present disclosure, which is observed by a high-resolution transmission electron microscope (HRTEM)
Figure 4B:
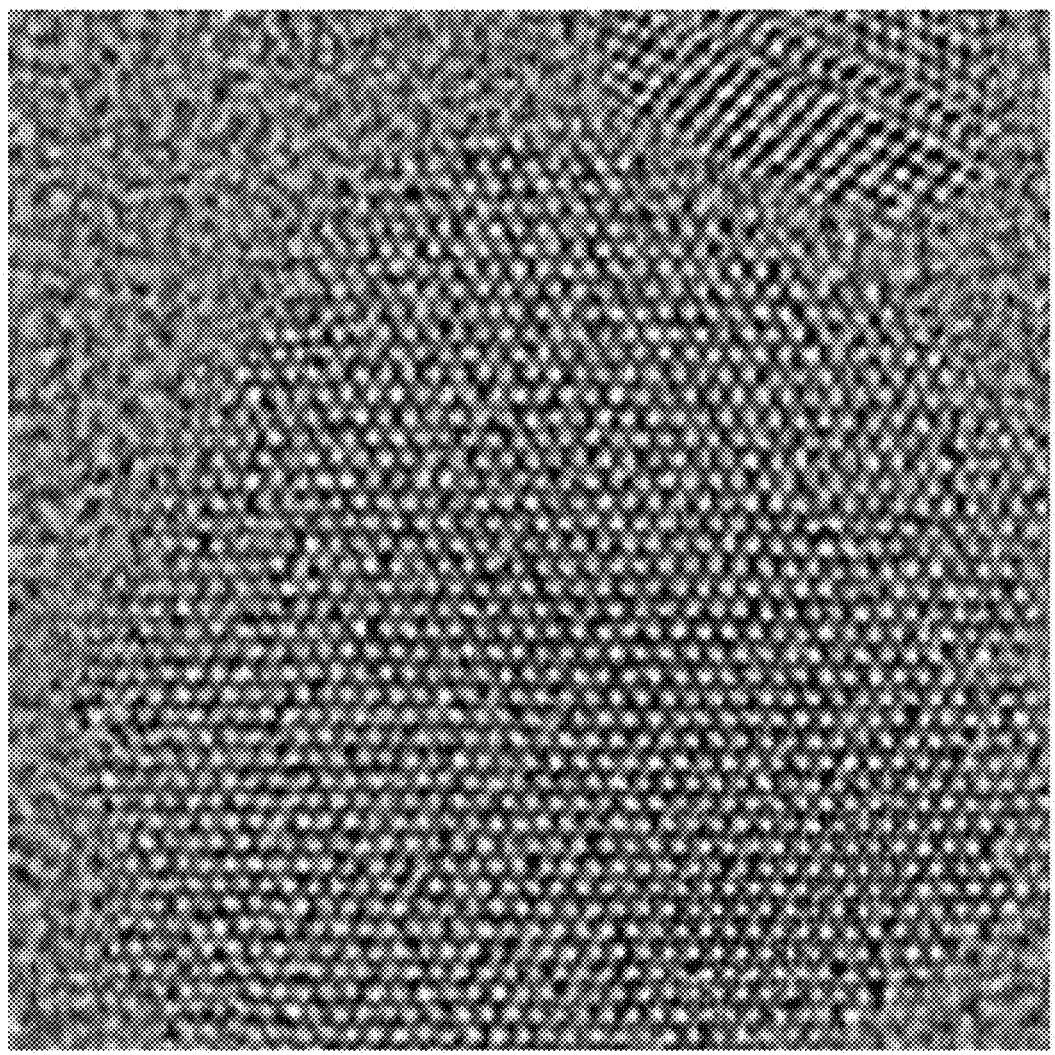
FIG. 4B shows a lattice image of a single quantum dot of the core-shell type light-emitting quantum dot according to Example 1 of the present disclosure, which is observed by a high-resolution transmission electron microscope (HRTEM)
Figure 5:
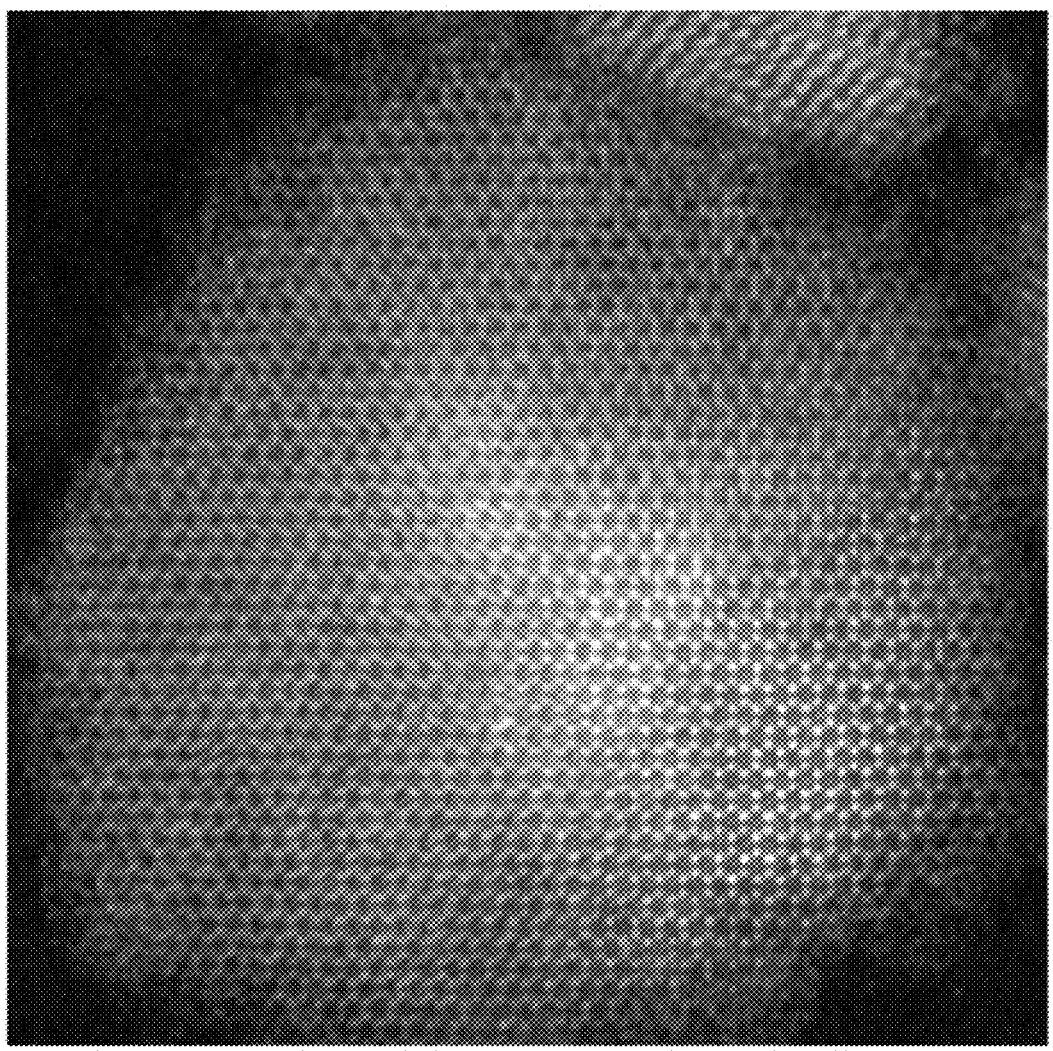
FIG. 5 shows an atomic arrangement image of the core-shell type light-emitting quantum dot according to Example 1 of the present disclosure, which is observed by a scanning transmission electron microscope-high-angle annular dark field (STEM-HAADF) image detector.

The core-shell type light-emitting quantum dot of this embodiment was observed through a high-resolution transmission electron microscope (HRTEM). Referring to FIG. 4A, the appearance of the core-shell type light-emitting quantum dot of this embodiment was a polygon with a plurality of corners. Referring to FIG. 4B, the lattice image of a single core-shell type light-emitting quantum dot was further observed. The atomic arrangement image of the single core-shell type light-emitting quantum dot was observed through a scanning transmission electron microscope-high-angle annular dark-field (STEM-HAADF) image detector, as shown in FIG. 5. It was clearly showed that the core-shell type light-emitting quantum dot of this embodiment had a zinc blende structure with an atomic stack arrangement.

Figure 6:
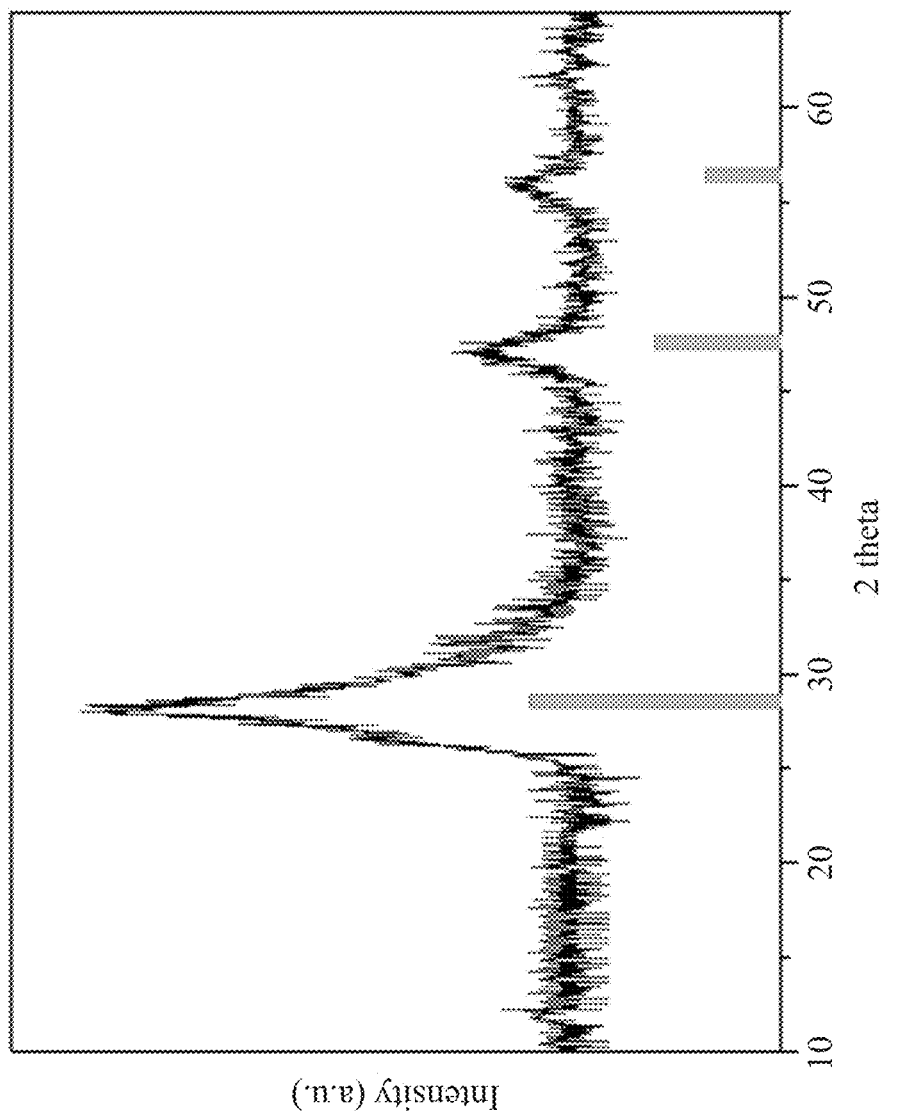
FIG. 6 shows an X-ray diffraction (XRD) pattern of the core-shell type light-emitting quantum dot according to Example 1 of the present disclosure, which is analyzed by X-ray diffractometry.

In addition, the above-mentioned lattice structure was further analyzed and illustrated by X-ray diffractometer, as shown in FIG. 6. It can be seen that the shell layer of the core-shell type light-emitting quantum dot of this embodiment exhibited a desired zinc blende structure.

Examples 2 to 6

The preparation method in these examples are the same as in Example 1, except that the concentrations of Cd metal precursor in the metal precursor solution containing the Cd metal precursor in Examples 2-6 were changed to 0.04 mmol, 0.08 mmol, 0.20 mmol, 0.42 mmol, and 1 mmol, respectively, to obtain the core-shell type light-emitting quantum dots.

Figure 7:
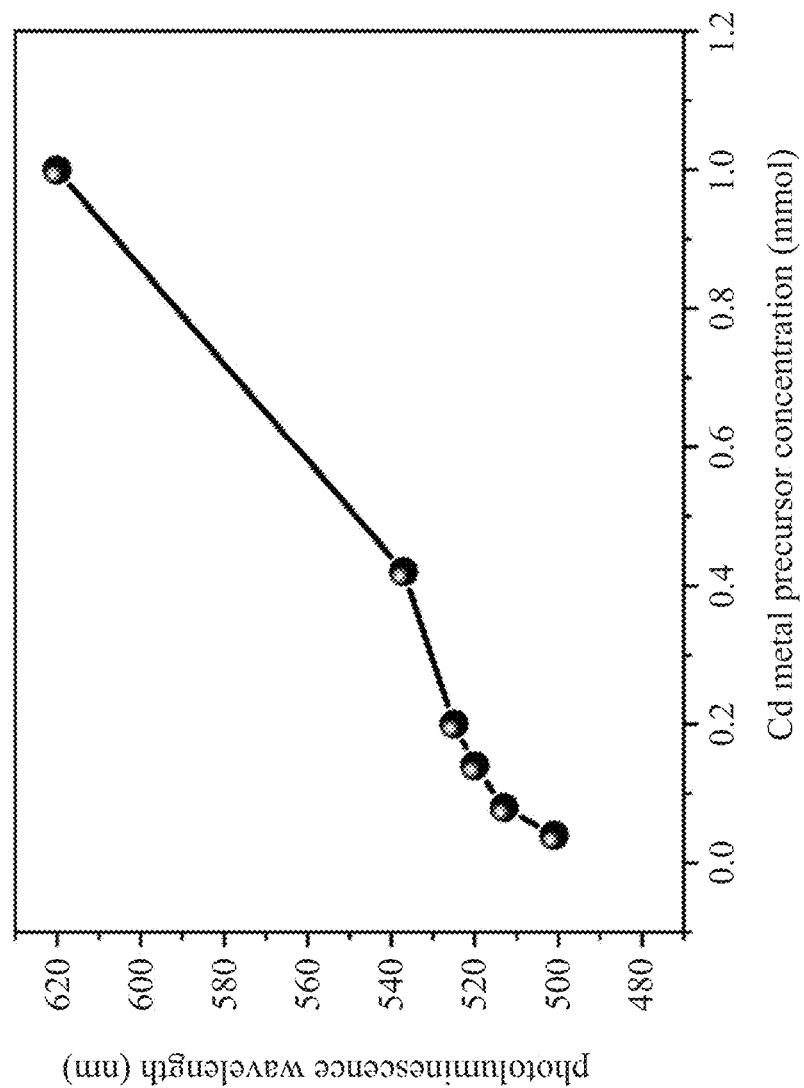
FIG. 7 is a graph showing the correspondence between the Cd metal precursor concentration and the photoluminescence wavelength of the core-shell type light-emitting quantum dots according to Examples 2-6 of the present disclosure.

The photoexcitation wavelengths of the above-mentioned Examples 1 to 6 were measured by a photoexcitation spectrometer, and the photoexcitation wavelength corresponding to each concentration of Cd metal precursor was recorded in FIG. 7.

Given the foregoing, the preparation method described in the present disclosure may provide a core-shell type light-emitting quantum dot with an alloy core, which has good dimensional uniformity and high luminous color purity.

Moreover, in the present disclosure, due to the activation by reactive amines, a shell layer with a zinc blende structure is formed on the alloy core. The shell layer with the zinc blende structure provides effective protection to the alloy core, improving the stability of the core-shell type light-emitting quantum dot and prolonging its service life. Furthermore, the core-shell type light-emitting quantum dot having the shell layer with zinc blende structure may withstand temperature even up to 250° C., and has high temperature resistance and excellent water- and oxygen-barrier performance.

By the combination of the alloy core with the shell layer having a zinc blende structure, the obtained core-shell type light-emitting quantum dot may achieve a quantum efficiency of 95%, such that the required power consumption is reduced, and the energy saving effect is obvious. Therefore, the core-shell type light-emitting quantum dot is suitable for industrial application.

The above embodiments are merely illustrative, and are not intended to limit the present disclosure. Those skilled in the art can modify and change the above embodiments without departing from the spirit and scope of the present disclosure. Therefore, the scope of the present disclosure is defined by the claims attached to the present disclosure. As long as the effect and implementation purpose of the present disclosure is not affected, it should be covered in this disclosed technical content.

What is claimed is:

1. A core-shell type light-emitting quantum dot, comprising:
    an alloy core consisting of Cd, Se, Zn, and S,
        wherein Cd, Se, Zn, and S are present at a center of the alloy core and are distributed from the center of the alloy core to a radius of 1 nanometers of the alloy core,
        wherein the alloy core has an element ratio of Zn and S each accounting for 30% to 50% of the alloy core, and has an element ratio of Cd and Se each accounting for 3% to 10% of the alloy core with a content of Cd and Se gradually decreasing outward from the center of the alloy core,
        wherein the alloy core has a radius of 3 nanometers or less; and
    a shell layer having a zinc blende structure and being coated on a surface of the alloy core.

2. The core-shell type light-emitting quantum dot of claim 1, which has a D90 particle size of from 12 to 15 nanometers.

3. The core-shell type light-emitting quantum dot of claim 1, which has an appearance of a polygon with a plurality of corners.

4. The core-shell type light-emitting quantum dot of claim 1, wherein the shell layer consists of ZnS.

5. A method for preparing the core-shell type light-emitting quantum dot of claim 1, comprising:
    providing a metal precursor solution containing a Cd metal precursor and a Zn metal precursor and activated by a reactive amine;
    mixing and reacting a first ion stock solution containing S ions and Se ions with the activated metal precursor solution containing the Cd metal precursor and the Zn metal precursor to obtain a solution containing an alloy core; and
    adding a second ion stock solution containing S ions and a zinc salt to the solution containing the alloy core for an reaction of forming a shell layer coated on a surface of the alloy core.

6. The method of claim 5, wherein the activated metal precursor solution containing the Cd metal precursor and the Zn metal precursor is prepared by a process comprising activating the Cd metal precursor by the reactive amine and a reactive acid.

7. The method of claim 6, wherein the process further comprises:
    providing a metal precursor solution containing the Cd metal precursor, wherein the Cd metal precursor is activated in the metal precursor solution containing the Cd metal precursor by the reactive amine and the reactive acid; and adding the Zn metal precursor to the activated metal precursor solution containing the Cd metal precursor to activate the Zn metal precursor at a temperature of from 300° C. to 320° C.

8. The method of claim 6, wherein the process further comprises:

providing the metal precursor solution containing the Cd metal precursor and the Zn metal precursor, wherein the Cd metal precursor is activated in the metal precursor solution containing the Cd metal precursor and the Zn metal precursor by the reactive amine and the reactive acid; and heating the activated metal precursor solution containing the Cd metal precursor and the Zn metal precursor to a temperature of from 300° C. to 320° C. to activate the Zn metal precursor.

9. The method of claim 6, wherein the reactive acid is oleic acid.

10. The method of claim 9, wherein the reactive amine and the reactive acid have a molar ratio of from 1:7 to 1:7.5.

11. The method of claim 6, wherein the Cd metal precursor is activated at a temperature of from 300° C. to 320° C.

12. The method of claim 5, wherein the reactive amine is a primary amine.

13. The method of claim 12, wherein the primary amine is oleylamine.

14. The method of claim 5, wherein the solution containing the alloy core is obtained at a reaction temperature of from 280° C. to 310° C. for 10 to 20 minutes.

15. The method of claim 14, wherein adding the second ion stock solution containing the S ions and the zinc salt further comprises:

adding the second ion stock solution containing the S ions to the solution containing the alloy core for 15 to 20 minutes; and adding the zinc salt to react for 20 to 30 minutes.

16. The method of claim 5, wherein the zinc salt is zinc oleate.

17. The method of claim 5, wherein the shell layer is formed at a reaction temperature of from 240° C. to 270° C.

18. The method of claim 5, wherein the reactive amine, the Cd metal precursor and the Zn metal precursor are in a molar ratio of from 3:0.14:5.9 to 3:1:5.9.

19. The method of claim 5, wherein the Cd metal precursor, the Zn metal precursor, the S ions and the Se ions are in a molar ratio of from 0.14:5.9:4.2:1.5 to 1:5.9:4.2:1.5.

\* \* \* \* \*